(12) United States Patent
Nurminen et al.

(10) Patent No.: US 7,996,725 B2
(45) Date of Patent: Aug. 9, 2011

(54) PROVIDING PROTECTION FOR A MEMORY DEVICE

(75) Inventors: Janne T. Nurminen, Oulunsalo (FI); Kimmo J. Mylly, Ylojarvi (FI); Matti K. Floman, Kangasala (FI)

(73) Assignee: Nokia Corporation, Espoo (FI)

( * ) Notice: Subject to any disclaimer, the term of this patent is extended or adjusted under 35 U.S.C. 154(b) by 255 days.

(21) Appl. No.: 12/291,872

(22) Filed: Nov. 14, 2008

(65) Prior Publication Data
US 2010/0125760 A1    May 20, 2010

(51) Int. Cl.
*G06F 11/00* (2006.01)
(52) U.S. Cl. ............. 714/42; 714/47.1; 714/25; 714/6.1
(58) Field of Classification Search ................ 714/6, 42, 714/5.1, 6.1, 25, 44, 47.1
See application file for complete search history.

(56) References Cited

U.S. PATENT DOCUMENTS

| 6,629,266 | B1* | 9/2003 | Harper et al. ................... 714/38 |
| 6,850,443 | B2 | 2/2005 | Lofgren et al. .......... 365/185.29 |
| 2003/0218960 | A1 | 11/2003 | Albrecht et al. .............. 369/126 |
| 2004/0047275 | A1 | 3/2004 | Cherubini et al. ............ 369/126 |
| 2005/0204232 | A1* | 9/2005 | Seuring ......................... 714/733 |
| 2006/0053247 | A1* | 3/2006 | Cheung et al. ................ 711/103 |
| 2007/0198786 | A1* | 8/2007 | Bychkov et al. .............. 711/154 |
| 2008/0151669 | A1 | 6/2008 | Bill et al. ....................... 365/222 |
| 2008/0313493 | A1* | 12/2008 | Roohparvar et al. ............. 714/6 |
| 2009/0161722 | A1* | 6/2009 | Gorman et al. ................ 374/142 |

FOREIGN PATENT DOCUMENTS
EP    1 858 021 A2    11/2007

OTHER PUBLICATIONS

E. Eleftheriou et al., Millipede—MEMS-based Scanning-Probe Date Storage System, IEEE Transactions on Magnetics, Mar. 2003, pp. 938-945, vol. 39, No. 2.

* cited by examiner

*Primary Examiner* — Scott T Baderman
*Assistant Examiner* — Sarai Butler
(74) *Attorney, Agent, or Firm* — Harrington & Smith

(57) ABSTRACT

A method for monitoring the status of a memory device is disclosed. The method includes, during operation of the memory device, exercising a first portion of the memory device more than at least one other portion of the memory device in order to induce an accelerated rate of aging of the first portion. The first portion is monitored to detect at least a potential for a failure in the first portion. According to the method, in response to monitoring the first portion, at least one corrective action is performed. Apparatus and computer readable media are also disclosed.

23 Claims, 3 Drawing Sheets

PROVIDING PROTECTION FOR A MEMORY DEVICE

TECHNICAL FIELD

The exemplary embodiments of this invention relate generally to memory devices and, more specifically, relate to monitoring the status of the memory device.

BACKGROUND

This section is intended to provide a background or context to this invention. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Memory components continue to proceed towards smaller and smaller sizes (e.g., current devices use 56 nm technologies, while future device may use 43 nm and 32 nm). For at least this reason, newer memory devices may become aged and corrupted faster than in prior generations.

Many memory components (e.g., NAND memory devices) are sensitive to temperature. In high temperature environments memory units may quickly become permanently corrupted. Thus, high temperatures can decrease the amount of allowed memory write/erase (W/E) cycles over a lifetime of the memory component.

Aging of the memory may depend on the particulars of the memory device, ambient temperatures, usage conditions and actual usage of the memory device.

Additionally, certain memory systems (e.g., flash memory) also experience "read-disturb" type failures. These failures occur when data in a first area which is adjacent to a second area is unintentionally altered due to activity in the second area.

Therefore, the reliability of memory components (e.g., max program erase (PE) cycle count, data retention, read/program disturbs, etc.) will become an even more important issue.

What is needed is a means to predict data corruption in a memory device that does not necessarily rely on a pre-determined fixed threshold.

SUMMARY

The following summary provides exemplary and non-limiting example in accordance with this invention.

An exemplary embodiment in accordance with this invention is a method for monitoring the status of a memory device. The method includes, during operation of the memory device, exercising a first portion of the memory device more than at least one other portion of the memory device in order to induce an accelerated rate of aging of the first portion. The first portion is monitored to detect at least a potential for a failure in the first portion. According to this method, in response to monitoring the first portion, at least one corrective action is performed.

An additional exemplary embodiment in accordance with this invention is an apparatus for monitoring the status of a memory device. The apparatus includes an interface configured to communicate with a memory device; and a processor coupled to the interface. The processor is configured, during operation of the memory device, to generate instructions to exercise a first portion of the memory device more than at least one other portion of the memory device in order to induce an accelerated rate of aging of the first portion; to monitor the first portion to detect at least a potential for a failure in the first portion; and in response to monitoring the first portion, to generate instructions to perform at least one corrective action.

A further exemplary embodiment in accordance with this invention is a computer-readable medium tangibly encoding a computer program for monitoring the status of a memory device. The computer program includes program instructions, execution of the program instructions resulting in operations including during operation of a memory device, exercising a first portion of the memory device more than at least one other portion of the memory device in order to induce an accelerated rate of aging of the first portion; monitoring the first portion to detect at least a potential for a failure in the first portion; and in response to monitoring the first portion, performing at least one corrective action.

An additional exemplary embodiment in accordance with this invention is an apparatus for monitoring the status of a memory device. The apparatus includes means for exercising a first portion of the memory device more than other portion(s) of the memory device in order to induce an accelerated rate of aging of the first portion. Means for monitoring the first portion to detect at least a potential for a failure in the first portion; and corrective means for performing at least one corrective action in response to monitoring the first portion are also included.

BRIEF DESCRIPTION OF THE DRAWINGS

The foregoing and other aspects of exemplary embodiments of this invention are made more evident in the following Detailed Description, when read in conjunction with the attached Drawing Figures, wherein.

DETAILED DESCRIPTION

Data corruption can be avoided by using protection cells in a memory device which indicate possible data failure risks before data corruption occurs throughout the memory device. A protection cell (which may also be referred to as a reference cell) may represent any region or area of the memory device. By using such protection cells, potential failures (or actual failures) in the protection cell can be noted and the remaining data may be preserved before becoming corrupted.

Figure 1:
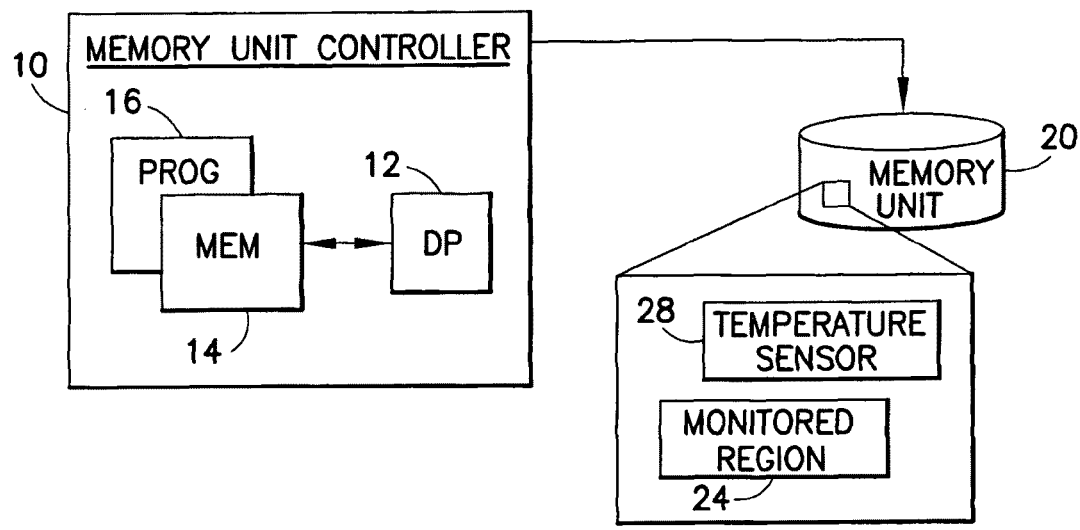
FIG. 1 shows a simplified block diagram of an electronic device that is suitable for use in practicing the exemplary embodiments of this invention.

Reference is made to FIG. 1 for illustrating a simplified block diagram of various electronic devices that are suitable for use in practicing the exemplary embodiments of this invention. In FIG. 1, a memory unit controller 10 is adapted for controlling a memory unit 20. The memory unit controller 10 includes a data processor (DP) 12, a memory (MEM) 14 coupled to the DP 12. The MEM 14 stores a program (PROG) 16.

The memory unit 20 includes one or more monitored regions 24. A monitored region 24 (e.g., a protection cell) may represent an arbitrarily designated sub-section of the physical structure of the memory unit 20, a physically defined sub-section of the physical structure of the memory unit 20 or a combination of the two. Additionally, memory unit 20 may include one or more temperature sensors 28 providing temperate data to the memory unit controller.

The PROG 16 is assumed to include program instructions that, when executed by the associated DP, enable the memory unit controller 10 to operate in accordance with the exemplary embodiments of this invention, as discussed herein.

In general, the various exemplary embodiments of the memory unit controller 10 can be included in, but are not limited to, cellular phones, personal digital assistants, portable computers, image capture devices, gaming devices having memory storage capabilities, music storage and playback appliances, Internet appliances having memory storage capabilities, as well as portable units or terminals that incorporate combinations of such functions.

The exemplary embodiments of this invention may be implemented by computer software executable by the DP 12 or by hardware, or by a combination of software and hardware.

The MEM 14 may be of any type suitable to the local technical environment and may be implemented using any suitable data storage technology, such as semiconductor based memory devices, magnetic memory devices and systems, optical memory devices and systems, fixed memory and removable memory, as non-limiting examples. The memory unit 20 may be implemented using any suitable data storage technology, such as semiconductor based memory devices, magnetic memory devices and systems, optical memory devices and systems, removable memory and fixed memory, as non-limiting examples.

The DP 12 may be of any type suitable to the local technical environment, and may include one or more of general purpose computers, special purpose computers, microprocessors, digital signal processors (DSPs) and processors based on a multi-core processor architecture, as non limiting examples.

Separate protection cells can be aged by increasing W/E cycles (or other memory access operations) to the protection cells over the lifetime of the memory device. This may be done, for example, by software (SW) within a computer or through instructions in a dedicated memory device controller. The amount the W/E cycles are increased may depend on the memory process stability and/or on other additional factors, for example, the temperature of the memory device, PE cycles reported, the work load of the memory device, etc. As a non-limiting example, the increase could range from 5% to 30%.

Exercising the protection cells allows for artificially aging to properly reflect effects caused by user behavior, memory manufacturing processes and the usage environment. Additionally, since the protection cells reflect a relative aging effect, there is no need for absolute parameter monitoring.

A protection cell in a memory device may be used to protect the other memory cells by monitoring the status of the protection cell, e.g. retention or voltage drop, wearing level, etc. Based on the status of the protection cell, the potential of a failure may be determined. This provides a cheap and easy to implement means for detecting memory aging effects. This may also be provided by easily configurable software.

Adding protection cell to a memory device and monitoring the state of the protection cell allows for determining the potential of a corruption risk in other memory sections to be determined. If the protection cell is aged more than the other memory cells, the protection cell is more likely to reflect the potential of becoming corrupted before the remaining data on the memory. Aging of the protection cell can be done via the software (SW) which may exercise the protection cell by adding more W/E cycles compared to the number of W/E cycles for the remaining memory cells. The amount the cycles are increased may be defined depending on the memory process.

A formula for exercising protection cells could be defined as: Protection cell W/E cycles=10 W/E cycles of average memory cell cycles+1 aging W/E cycle. This would provide a 10% increase of W/E cycles. Furthermore, the amount of increased W/E cycles may be independently determined for each protection cell individually or the increase may be averaged across all protection cells.

In accordance with an exemplary embodiment, when a normal memory cell has a W/E cycle, the W/E cycle is performed on the protection cell. Thus, the protection cell is aged hand in hand with the normal memory. When the normal memory cell and protection cell have both had a set number of W/E cycles (e.g., ten (10)), the protection cell is exercised with additional W/E cycles (e.g., one (1)). Thus, the protection cell will be exercise with eleven (11) W/E cycles for each 10 W/E cycles performed for the normal memory cell cycles. This generates a 10% increase of W/E cycles.

Alternatively, the exercising (aging) cycles for the protection cell may be delayed based on the activity of the memory device. Thus, the protection cell may be aged at a time when the memory device is relatively idle.

Protection cells may be special cells that do not make up part of the general memory. Alternatively the protection cells may be part of the general memory which is exercised by the SW according the aging formula.

Another possibility is to use physically less optimum protection cells (e.g., in allowed W/E cycle sense) which will likely become corrupted before the other data cells. For example, a protection cell could have a "weaker" W/E performance than normal memory. Thus it will become corrupted before a normal memory cell (even without forced aging).

Yet another possible addition would be to include one or more fixed charge cells in the memory device and if the charge drops below a threshold level, triggering a refresh (and also the fixed cell would be reprogrammed).

Different corrective actions can be activated when a potential failure is monitored in the protection cell (e.g., before the remaining memory data is corrupted): 1) Refresh the memory; 2) Provide warnings (e.g., to the user, the computer, etc.); 3) perform a backup procedure; and/or 4) Erase memory cells.

The memory device may also include multiple protection cells. These cells may be distributed throughout the memory device. This allows for the protection cells to reflect local aging differences on the memory device and thus different aging effect through the whole memory device.

Additionally, the use of multiple protection cells may provide an indication as to the urgency of the warning as more protection cells become corrupted. Thus, different types of warnings can be sent to the user. These warning may range in urgency, for example, a simple warning, an indication of high corruption risk, and/or a prediction of a fatal failure.

Based on monitoring a potential failure (e.g., an actual failure in a protection cell) or a received warning, a refresh of the memory device may be requested. Additional actions may also be undertaken, for example, beginning a backup procedure, etc.

Data corruption in the protection cell may be determined using a number of different methods. The cell may include a copy of predetermined data (e.g., a string, etc.) that the data read from the cell is checked against. Alternatively the cell may include a mirror copy of another data cell (which may be a second protection cell) and the data in the two cells may be routinely checked against each other and/or the data in the cell may have an error check code (e.g., a checksum) against which the data is compared.

The memory device may also include one or more temperature sensors providing an indication of the temperature within the device. The temperature sensor can be of any type suitable to the local technical environment and may be implemented using any suitable technology (e.g., diode, transistor, digital, determined based on the physical characteristics of the memory). Also, the temperature sensor may be located internally in the memory or externally inside of another component or a stand alone sensor near the memory. Alternatively, the additional W/E cycles for the protection cell may depend on the temperature. W/E operations may also be suspended while the temperature exceeds a given threshold (e.g., 85° C.). For example, the increase in W/E cycles may follow the non-linear structure as in Table 1:

TABLE 1

| Temperature Range | W/E Cycle Increase |
| --- | --- |
| <60° C. | +10% |
| 60° C. to 80° C. | +20% |
| 80° C. to 85° C. | +30% |
| >85° C. | No W/E cycles allowed |

Additionally (or alternatively), the W/E cycle increase may depend on the PE cycles reported. The increase in W/E cycles may follow the structure as in Table 2:

TABLE 2

| PE cycles reported | W/E Cycle Increase |
| --- | --- |
| <1000 | +10% |
| 1000 to 3000 | +20% |
| >3000 | +30% |

Using multiple protection cells it is possible to detect "read-disturb" type failures by having two neighboring reference cells. One cell could store fixed reference data and the other cell could be exercised by receiving the increased W/E cycles as disclosed above. The fixed reference data may be compared to the data within the cell. Thus, changes in the data resulting from the activity in the adjacent cell will be detected.

Figure 2:
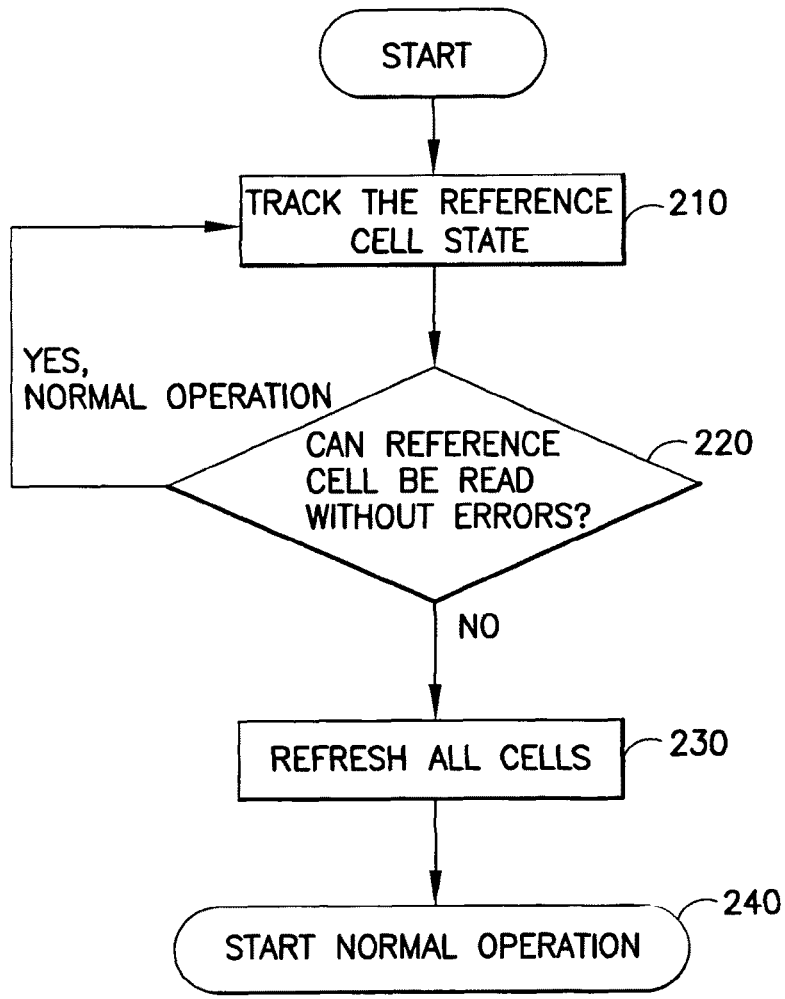
FIG. 2 depicts a flowchart illustrating a first non-limiting example of a method for practicing the exemplary embodiments of this invention.

FIG. 2 depicts a flowchart illustrating a first non-limiting example of a method for practicing the exemplary embodiments of this invention. The cell state of the reference cell is tracked at 210. At 220, it is determined whether the reference cell can be read without errors. If no errors are detected, normal operation returns to tracking the reference cell state at 210. If errors are detected, all cells are refreshed at 230. At 240, normal operations are resumed.

The reference cell may be checked after a pre-determined number of operations. Additionally, the number of operations may be adjusted according to the context of the memory storage (e.g., the temperature, amount of time between W/E operations, etc.).

Figure 3:
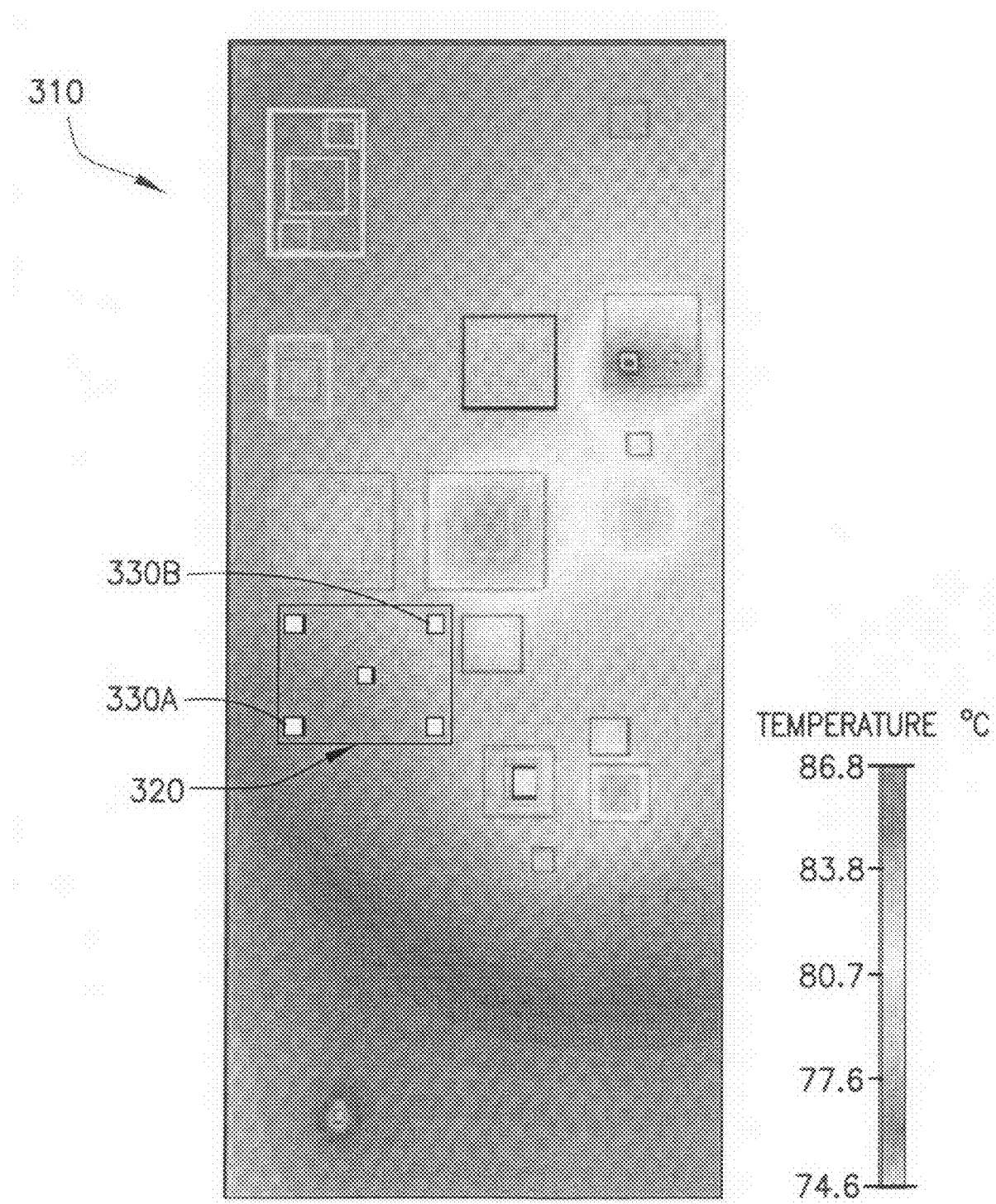
FIG. 3 shows a simplified illustration of a temperature distribution in an electronic device.

FIG. 3 shows a simplified illustration of a temperature distribution in an electronic device. A memory unit 20 may include a region 310. Within this region 310 is a sub-region 320 that includes protection cells 330A and 330B. As shown, the temperature difference between 330A and 330B is approximately 3° C.

Figure 4:
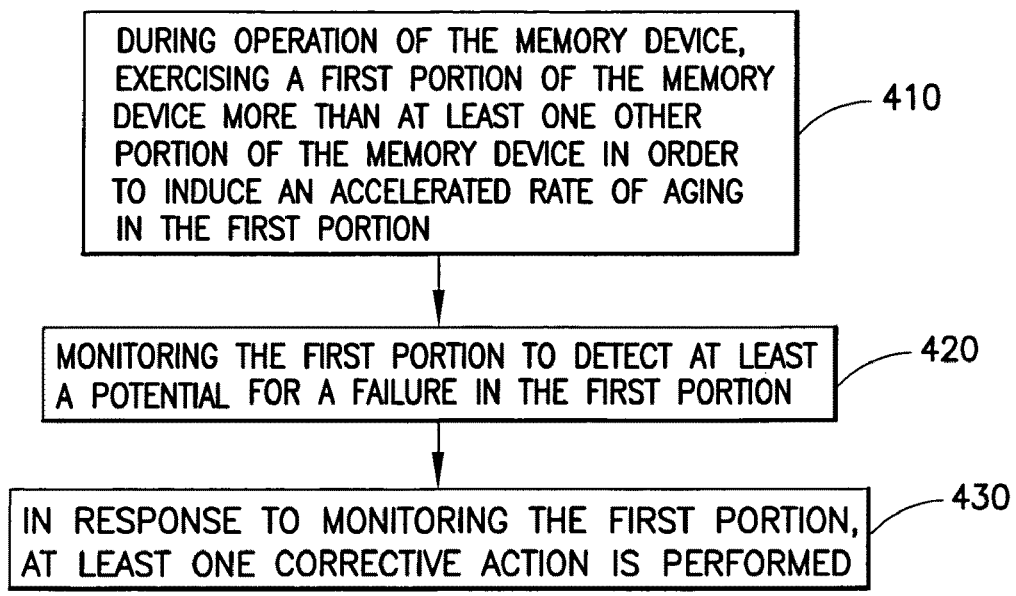
FIG. 4 depicts a flowchart illustrating a second non-limiting example of a method for practicing the exemplary embodiments of this invention.

FIG. 4 depicts a flowchart illustrating a second non-limiting example of a method for practicing the exemplary embodiments of this invention. At block 410, the method includes, during operation of the memory device, exercising a first portion of the memory device more than at least one other portion of the memory device in order to induce an accelerated rate of aging of the first portion. Monitoring the first portion to detect at least a potential for a failure in the first portion is included at block 420. At block 430, in response to monitoring the first portion, at least one corrective action is performed.

Figure 5:
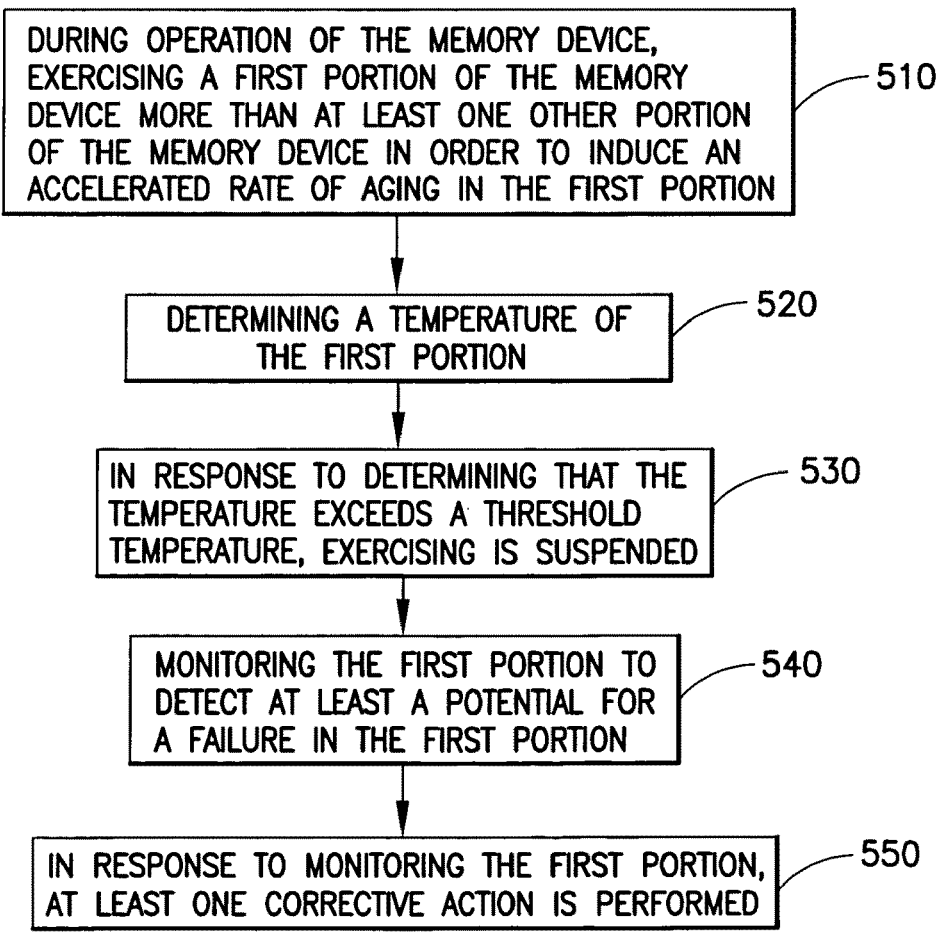
FIG. 5 depicts a flowchart illustrating a third non-limiting example of a method for practicing the exemplary embodiments of this invention.

FIG. 5 depicts a flowchart illustrating a third non-limiting example of a method for practicing the exemplary embodiments of this invention. At block 510, the method includes, during operation of the memory device, exercising a first portion of the memory device more than at least one other portion of the memory device in order to induce an accelerated rate of aging of the first portion. The method also includes determining a temperature of the first portion at block 520. At block 530, in response to determining that the temperature exceeds a threshold temperature, exercising is suspended. Monitoring the first portion to detect at least a potential for a failure in the first portion is included at block 540. At block 550, in response to monitoring the first portion, at least one corrective action is performed.

The blocks depicted in FIGS. 4 and 5 may also be considered to correspond to one or more functions and/or operations that are performed by one or more components, apparatus, processors, computer programs, circuits, integrated circuits, application-specific integrated circuits (ASICs), chips and/or function blocks. Any and/or all of the above may be implemented in any practicable arrangement or solution that enables operation in accordance with the exemplary embodiments of the invention.

Furthermore, the arrangement of the blocks shown in FIGS. 4 and 5 should be considered merely exemplary and non-limiting. It should be appreciated that the blocks depicted in FIGS. 4 and 5 may correspond to one or more functions and/or operations that may be performed in any order (e.g., any practicable, suitable and/or feasible order) and/or concurrently (e.g., as practicable, suitable and/or feasible) so as to implement one or more of the exemplary embodiments of the invention. In addition, one or more additional steps, functions and/or operations may be utilized in conjunction with those illustrated in FIGS. 4 and 5 so as to implement one or more further exemplary embodiments of the invention, such as those described in further detail herein.

That is, the non-limiting, exemplary embodiments of the invention shown in FIGS. 4 and 5 may be implemented, practiced or utilized in conjunction with one or more further aspects in any combination (e.g., any combination that is suitable, practicable and/or feasible) and are not limited only to the blocks, steps, functions and/or operations illustrated in FIGS. 4 and 5.

Below are provided further descriptions of various non-limiting, exemplary embodiments. The below-described exemplary embodiments are separately numbered for clarity and identification. This numbering should not be construed as wholly separating the below descriptions since various aspects of one or more exemplary embodiments may be practiced in conjunction with one or more other aspects or exemplary embodiments. That is, the exemplary embodiments of the invention, such as those described immediately below, may be implemented, practiced or utilized in any combination (e.g., any combination that is suitable, practicable and/or feasible) and are not limited only to those combinations described herein and/or included in the appended claims.

An exemplary embodiment in accordance with this invention is a method for monitoring the status of a memory device. The method includes, during operation of the memory device, exercising a first portion of the memory device (e.g., the protection cell) more than at least one other portion of the memory device in order to induce an accelerated rate of aging of the first portion (relative to a non-accelerated rate of aging (e.g., normal operation) of the at least one other portion). The first portion is monitored to detect at least a potential for a failure in the first portion. According to this method, in response to monitoring the first portion (e.g., detecting a potential for a failure in the first portion, detecting an actual failure in the first portion, etc.), at least one corrective action is performed.

In a further exemplary embodiment of the method above, exercising includes performing additional memory access operations. The accelerated rate of aging of the first portion may be at least 10% more rapid than the non-accelerated rate of aging of the at least one other portion.

In an additional exemplary embodiment of any one of the methods above, the accelerated rate of aging of the first portion may further be based on a temperature of the first portion, an average temperature of the at least one other portion and/or a number of program erase cycles reported for the at least one other portion.

In a further exemplary embodiment of any one of the methods above, the method also includes determining a temperature of the first portion. In response to determining that the temperature exceeds a threshold temperature, exercising is suspended.

In an additional exemplary embodiment of any one of the methods above, monitoring the first portion includes determining whether a charge in the first portion drops below a threshold. The threshold may be a fixed threshold or a relative-threshold based on the at least one other portion of the memory device.

In a further exemplary embodiment of any one of the methods above, monitoring the first portion includes reading first data from the first portion and determining whether the first data contains errors. Determining whether the first data contains errors may include comparing a checksum of the first data, comparing the first data to predetermined data and/or comparing the first data to second data read from the at least one other portion of the memory device.

In an additional exemplary embodiment of any one of the methods above, the at least one corrective action includes generating a warning, refreshing the memory device and/or performing a backup procedure of the memory device. The warning may also include an indication of urgency.

In a further exemplary embodiment of any one of the methods above, the first portion includes a first section and a second section adjacent to the first section. Exercising the first portion includes exercising the first section and monitoring the first portion includes monitoring the second section to detect a failure in the second portion.

An additional exemplary embodiment in accordance with this invention is an apparatus for monitoring the status of a memory device. The apparatus includes an interface configured to communicate with a memory device; and a processor coupled to the interface. The processor is configured, during operation of the memory device, to generate instructions to exercise a first portion of the memory device more than at least one other portion of the memory device in order to induce an accelerated rate of aging of the first portion (relative to a non-accelerated rate of aging of the at least one other portion); to monitor the first portion to detect at least a potential for a failure in the first portion; and in response to monitoring the first portion, to generate instructions to perform at least one corrective action.

In a further exemplary embodiment of the apparatus above, the processor is further configured to exercise the first portion by generating instructions to perform additional memory access operations. The processor may be further configured to determine a temperature of the first portion; and in response to determining that the temperature exceeds a threshold temperature. Alternative, the processor may be further configured to receive an indication that a temperature of the first portion exceeds a threshold temperature and, in response to receiving the indication, to suspend exercising In an additional exemplary embodiment of any one of the apparatus above, the at least one corrective action includes generating a warning, refreshing the memory device and/or performing a backup procedure of the memory device.

In a further exemplary embodiment of any one of the apparatus above, the processor is embodied in an integrated circuit.

In an additional exemplary embodiment of any one of the apparatus above, the apparatus also includes the memory device, where the memory device is a flash memory device.

In a further embodiment of any one of the apparatus above, the apparatus also includes a part of a memory storage system, a mobile phone or a computer system.

An additional exemplary embodiment in accordance with this invention is a computer-readable medium tangibly encoding a computer program for monitoring the status of a memory device. The computer program includes program instructions, execution of the program instructions resulting in operations including during operation of a memory device, exercising a first portion of the memory device more than at least one other portion of the memory device in order to induce an accelerated rate of aging of the first portion (relative to a non-accelerated rate of aging of the at least one other portion); monitoring the first portion to detect at least a potential for a failure in the first portion; and in response to monitoring the first portion, performing at least one corrective action.

In a further exemplary embodiment of the computer-readable medium above, exercising includes performing additional memory access operations.

In an additional exemplary embodiment of any one of the computer-readable medium above, the accelerated rate of aging of the first portion is further based on a temperature of the first portion, an average temperature of the at least one other portion and/or a number of program erase cycles reported for the at least one other portion.

In a further exemplary embodiment of any one of the computer-readable medium above, monitoring the first portion includes reading first data from the first portion and determining whether the first data contains errors.

In an additional exemplary embodiment of any one of the computer-readable medium above, the at least one corrective action includes generating a warning, refreshing the memory device and/or performing a backup procedure of the memory device.

A further exemplary embodiment in accordance with this invention is an apparatus for monitoring the status of a memory device. The apparatus includes means for exercising a first portion of the memory device more than other portion (s) of the memory device in order to induce an accelerated rate of aging of the first portion (relative to a non-accelerated rate of aging of the other portion(s)). Means for monitoring the first portion to detect at least a potential for a failure in the first portion; and corrective means for performing at least one corrective action in response to monitoring the first portion are also included.

In an additional exemplary embodiment of the apparatus above, the exercising means exercises the first portion by generating instructions to perform additional memory access operations. The apparatus may also include means for determining a temperature of the first portion; and means for suspending exercising in response to determining that the temperature exceeds a threshold temperature.

In a further exemplary embodiment of any one of the apparatus above, the at least one corrective action includes generating a warning, refreshing the memory device and/or performing a backup procedure of the memory device.

In an additional exemplary embodiment of any one of the apparatus above, the apparatus is embodied in an integrated circuit.

In a further exemplary embodiment of any one of the apparatus above, the exercising means is a processor, the monitoring means is a processor and the corrective means is a processor.

A further exemplary embodiment in accordance with this invention is a signal for monitoring the status of a memory device. The signal includes program instructions, execution of the program instructions resulting in operations including during operation of a memory device, exercising a first portion of the memory device more than at least one other portion of the memory device in order to induce an accelerated rate of aging of the first portion; monitoring the first portion to detect at least a potential for a failure in the first portion; and in response to monitoring the first portion, performing at least one corrective action.

The exemplary embodiments of the invention, as discussed above and as particularly described with respect to exemplary methods, may be implemented as a computer program product comprising program instructions embodied on a tangible computer-readable medium. Execution of the program instructions results in operations comprising steps of utilizing the exemplary embodiments or steps of the method.

The exemplary embodiments of the invention, as discussed above and as particularly described with respect to exemplary methods, may be implemented in conjunction with a program storage device (e.g., a computer-readable medium, a memory) readable by a machine (e.g., a computer, a mobile station, a mobile device, a mobile node), tangibly embodying a program of instructions (e.g., a program, a computer program) executable by the machine for performing operations. The operations comprise steps of utilizing the exemplary embodiments or steps of the method.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Still further, the various labels (e.g., NAND) used are not intended to be limiting in any respect, as these labels may be identified by any suitable names.

Programs may be used to automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

Furthermore, some of the features of the preferred embodiments of this invention could be used to advantage without the corresponding use of other features. As such, the foregoing description should be considered as merely illustrative of the principles of the invention, and not in limitation thereof.

The invention claimed is:

1. A method comprising:

during operation of a memory device, exercising a first portion of the memory device more than at least one other portion of the memory device in order to induce an accelerated rate of aging of the first portion relative to a non-accelerated rate of aging of the at least one other portion, where the accelerated rate of aging is based at least in part on the non-accelerated rate of aging;

monitoring the first portion to determine whether at least a potential for a failure exists in the at least one other portion; and in response to determining that at least a potential for a failure exists in the at least one other portion, performing at least one corrective action in order to preserve data stored in the at least one other portion.

2. The method of claim 1, where exercising comprises, in response to at least one memory access operations in the at least one other portion, performing an equal number of memory access operations to the first portion and at least one additional memory access operation to the first portion.

3. The method of claim 2, where the accelerated rate of aging of the first portion is at least 10% more rapid than the non-accelerated rate of aging of the at least one other portion.

4. The method of claim 1, where the accelerated rate of aging of the first portion is further based on at least one of a temperature of the first portion, an average temperature of the at least one other portion and a number of program erase cycles reported for the at least one other portion.

5. The method of claim 1, further comprising:
determining a temperature of the first portion; and
in response to determining that the temperature exceeds a threshold temperature, suspending exercising.

6. The method of claim 1, where monitoring the first portion comprises determining whether a charge in the first portion drops below a threshold,
where the threshold is one of a fixed threshold or a relative threshold based on a charge in the at least one other portion of the memory device.

7. The method of claim 1, where monitoring the first portion comprises reading first data from the first portion and determining whether the first data contains errors.

8. The method of claim 7, where determining whether the first data contains errors comprises at least one of comparing a checksum of the first data, comparing the first data to predetermined data and comparing the first data to second data read from the at least one other portion of the memory device.

9. The method of claim 1, where the at least one corrective action comprises at least one of generating a warning, refreshing the memory device and performing a backup procedure of the memory device.

10. The method of claim 9, where the warning comprises an indication of urgency.

11. The method of claim 1, where the first portion comprises a first section and a second section adjacent to the first section;
where exercising the first portion comprises exercising the first section; and
monitoring the first portion comprises monitoring the second section to detect a failure in the second portion.

12. The method of claim 1, where exercising the first portion is performed when the memory device is relatively idle.

13. The method of claim 1, where monitoring the first portion comprises:
detecting whether a failure occurs in the first portion; and
in response to detecting that a failure has occurred in the first portion, determining that at least a potential for a failure exists in the at least one other portion.

14. An apparatus comprising:
an interface configured to communicate with a memory device; and
a processor coupled to the interface,
where the processor is configured, during operation of the memory device, to generate instructions to exercise a first portion of the memory device more than at least one other portion of the memory device in order to induce an accelerated rate of aging of the first portion relative to a non-accelerated rate of aging of the at least one other portion, where the accelerated rate of aging is based at least in part on the non-accelerated rate of aging;
to monitor the first portion to determine whether at least a potential for a failure in the at least one other portion; and
in response to determining that at least a potential for a failure exists in the at least one other portion, to generate instructions to perform at least one corrective action in order to preserve data stored in the at least one other portion.

15. The apparatus of claim 14, where the processor is further configured, in response to at least one memory access operations in the at least one other portion, to exercise the first portion by generating instructions to perform an equal number of memory access operations to the first portion and at least one additional memory access operation to the first portion.

16. The apparatus of claim 14, where the processor is further configured:
to receive an indication of a temperature of the first portion exceeds a threshold temperature; and
in response to the indication, to suspend exercising.

17. The apparatus of claim 14, where the at least one corrective action comprises at least one of generating a warning, refreshing the memory device and performing a backup procedure of the memory device.

18. The apparatus of claim 14, further comprising the memory device, where the memory device is a flash memory device.

19. A computer-readable medium tangibly encoding a computer program comprising program instructions, execution of the program instructions resulting in operations comprising:
during operation of a memory device, exercising a first portion of the memory device more than at least one other portion of the memory device in order to induce an accelerated rate of aging of the first portion relative to a non-accelerated rate of aging of the at least one other portion, where the accelerated rate of aging is based at least in part on the non-accelerated rate of aging;
monitoring the first portion to determine whether at least a potential for a failure in the at least one other portion; and
in response to determining that at least a potential for a failure exists in the at least one other portion, performing at least one corrective action in order to preserve data stored in the at least one other portion.

20. The computer-readable medium of claim 19, where exercising comprises, in response to at least one memory access operations in the at least one other portion, performing an equal number of memory access operations to the first portion and at least one additional memory access operation to the first portion.

21. The computer-readable medium of claim 19, where the accelerated rate of aging of the first portion is further based on at least one of a temperature of the first portion, an average temperature of the at least one other portion and a number of program erase cycles reported for the at least one other portion.

22. The computer-readable medium of claim 19, where monitoring the first portion comprises reading first data from the first portion and determining whether the first data contains errors.

23. The computer-readable medium of claim 19, where the at least one corrective action comprises at least one of generating a warning, refreshing the memory device and performing a backup procedure of the memory device.

* * * * *